(12) United States Patent
Liu et al.

(10) Patent No.: US 7,268,710 B1
(45) Date of Patent: Sep. 11, 2007

(54) LOGIC DEVICE FOR THE TRANSFORMATION OF THE OUTPUT OF THE RDC INTO SERIES A-B PULSES

(75) Inventors: Ming-Hsing Liu, Taichung (TW); Ming-Yuan Lee, Taichung (TW)

(73) Assignee: Hiwin Mikrosystems Corp., Taichung (TW)

( * ) Notice: Subject to any disclaimer, the term of this patent is extended or adjusted under 35 U.S.C. 154(b) by 0 days.

(21) Appl. No.: 11/484,537

(22) Filed: Jul. 11, 2006

(51) Int. Cl.
*H03M 1/48* (2006.01)

(52) U.S. Cl. .......... 341/112; 341/113; 341/114

(58) Field of Classification Search ........ 341/111–117; 318/594, 595, 605, 601
See application file for complete search history.

(56) References Cited

U.S. PATENT DOCUMENTS

| | | | | |
|---|---|---|---|---|
| 3,882,487 A | * | 5/1975 | Rosenberg | 341/114 |
| 4,021,714 A | * | 5/1977 | Jones et al. | 318/594 |
| 4,321,684 A | * | 3/1982 | Sommeria | 708/3 |
| 4,989,001 A | * | 1/1991 | Serev | 341/116 |
| 5,451,945 A | * | 9/1995 | Alhorn et al. | 341/110 |
| 5,455,498 A | * | 10/1995 | Kakimoto et al. | 318/605 |
| 5,786,781 A | * | 7/1998 | Taniguchi et al. | 341/111 |
| 6,320,524 B1 | * | 11/2001 | Takehara | 341/116 |
| 6,323,790 B1 | * | 11/2001 | Takehara | 341/111 |
| 7,005,812 B2 | * | 2/2006 | Mitchell | 318/254 |
| 7,084,790 B2 | * | 8/2006 | Borrello et al. | 341/117 |

* cited by examiner

*Primary Examiner*—Linh V. Nguyen
(74) *Attorney, Agent, or Firm*—Charles E. Baxley

(57) ABSTRACT

A logic device for the transformation of the output of the RDC into series A-B pulses according to the present invention comprises: a chip with its two minimal bits (LSB-LSB-1) simulating as the clock source of A-B pulses, a signal-processing pin (BUSY) which output a TTL pulse wave as a control signal resource while LSB shifts from a low level to a high level and contrariwise, and a logic processing circuit as well as a buffer to output the displacement and velocity of a rotor in the form of A-B serial pulses.

2 Claims, 7 Drawing Sheets

( PHASE A )

( PHASE B )

LOGIC DEVICE FOR THE TRANSFORMATION OF THE OUTPUT OF THE RDC INTO SERIES A-B PULSES

BACKGROUND OF THE INVENTION

1. Field of the Invention

The present invention relates to electron logic devices and, more particularly, to an electron logic device which converts 16-bit parallel output signals derived from a Resolver-to-Digital Converter (RDC) into A-B serial output pulses compatible with an Encoder driver to conduct position-feedback control and substitute for a microprocessor to thereby contribute to simplifying the entire converting system.

2. Description of Related Art

A motor transfers electrical energy into mechanical energy to supply power for various mechanical loads which commonly present as variable motion and positioning motion. Such a motor is generally equipped with a Position/Velocity Detector to detect the position and velocity hereof. Typical forms of conventional Position/Velocity Detectors are Encoder and Resolver wherein the former meets a request for relatively higher resolution and facilitates enhancing the control precision while a latter performs relatively lower resolution, yet presents better noise immunity and requires less cost.

An (incremental) Encoder outputs two sets of quad waves with 90 degrees phase difference mutually during the rotation of a motor, as shown in FIG. 1. Subsequently, a microprocessor figures out the rotational angle data of the motor shaft by calculating said square-waved signals with the circuit thereof and the velocity of the motor is further determined through differentiating that rotational angle data.

Differently, a Resolver outputs two sets of AM modulating signals with 90 degrees phase difference mutually by the reluctances of its mover and stator, as shown in FIG. 2. The waveform thereof consists of fundamental frequency with excitation signals and sinusoid containing position data. Then an analog circuit in the Resolver analyses the position data form those carrier signals to derive feedback signals as shown in FIG. 3 to the motor.

From the above-mentioned, deficiencies of the conventional converting technique may include:

1. the circuits of the traditional converting system may occupy significantly large layout area;
2. the traditional converting system may lack of expandability;
3. the traditional converting system may only suit with certain types of drivers and therefore lack of elastic applicability; and
4. the traditional converting system requires a microprocessor that inevitably increases the cost and the complexity the entire system.

Thus, the traditional design of a converting system may be uneconomical and therefore a need exists for an advanced and improved converting system. In view of such a need, the Inventor who has plenty years of experience in circuit technology herein disclose a novel device to eliminate said defects and improve the utility.

SUMMARY OF THE INVENTION

The present invention has been accomplished under the circumstances in view. It is one object of the present invention to provide an electron logic device for a Resolver-to-Digital Converter (RDC) to output converted A-B serial pulses while accomplishing a simplified system structure by superseding a microprocessor.

To achieve this and other objects of the present invention, a logic device for the transformation of the output of the RDC into series A-B pulses according to the present invention comprises: a chip with its two minimal bits (LSB-LSB-1) simulating as the clock source of A-B pulses, a signal-processing pin (BUSY) which output a TTL pulse wave as a control signal resource while LSB shifts from a low level to a high level and contrariwise, and a logic processing circuit to output the displacement and velocity of a rotor in the form of A-B serial pulses.

The foregoing and other objects and advantages will best be understood by reference to the following detailed description of an illustrative embodiment when read in conjunction with the accompanying drawings.

The technical measures taken by the invention to achieve foregoing purpose and effect are given below:

a logic device for the transformation of the output of the RDC into series A-B pulses according to the present invention comprises: a chip with its two minimal bits (LSB-LSB-1) simulating as the clock source of A-B pulses, a signal-processing pin (BUSY) which output a TTL pulse wave as a control signal resource while LSB shifts from a low level to a high level and contrariwise, and a logic processing circuit as well as a buffer to output the displacement and velocity of a rotor in the form of A-B serial pulses.

DETAILED DESCRIPTION OF THE PREFERRED EMBODIMENT

Figure 1:
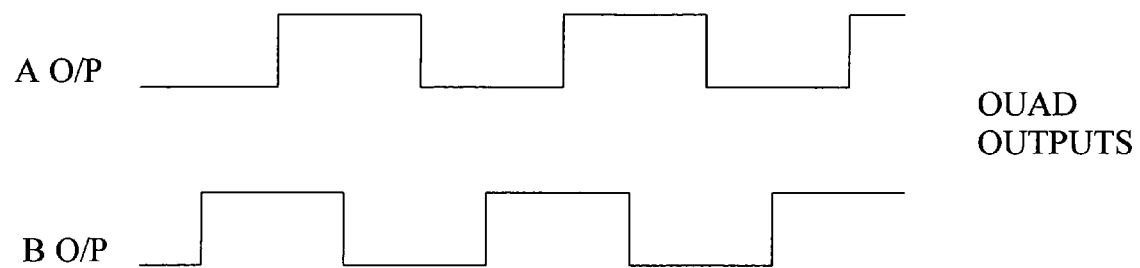
FIG. 1 is a diagram of traditional incremental output signals.
Figure 2:
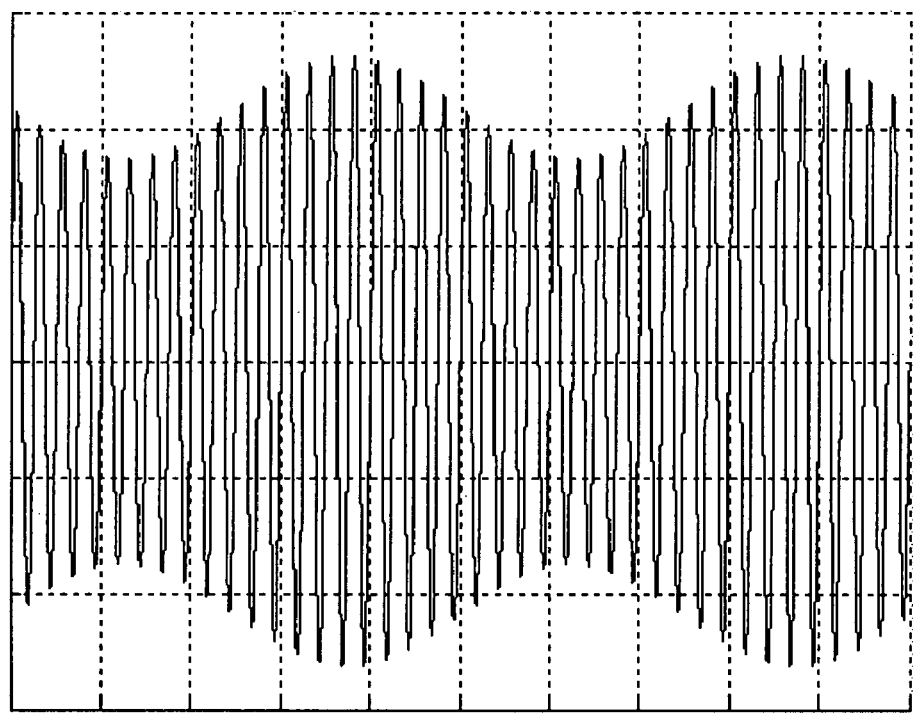
FIG. 2 is a set of diagrams showing traditional A-B phase waves.
Figure 2:
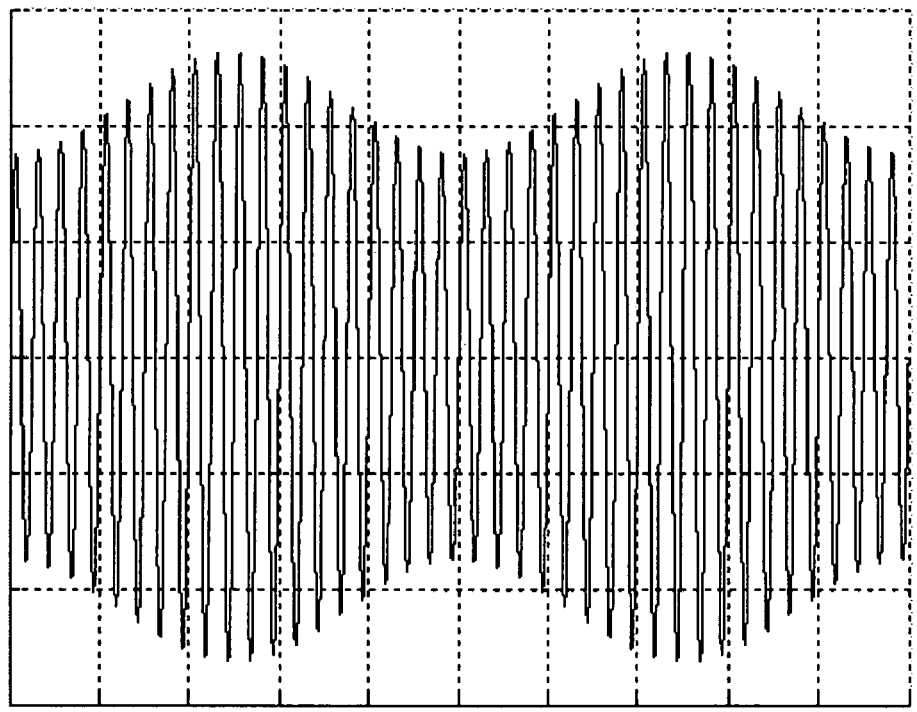
Figure 3:
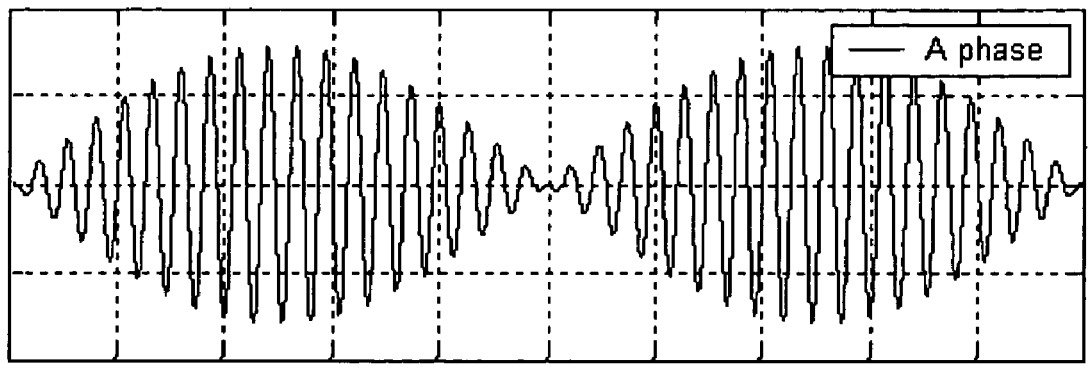
FIG. 3 is a set of diagrams showing output signals of a conventional resolve.
Figure 3:
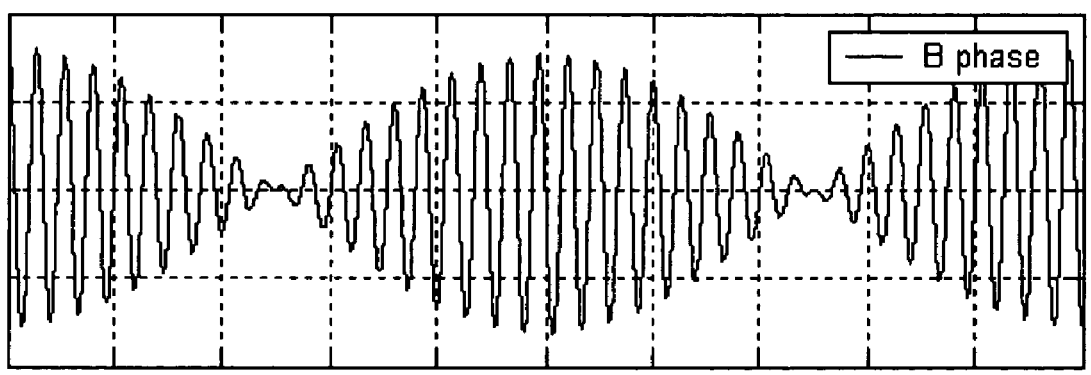
Figure 4:
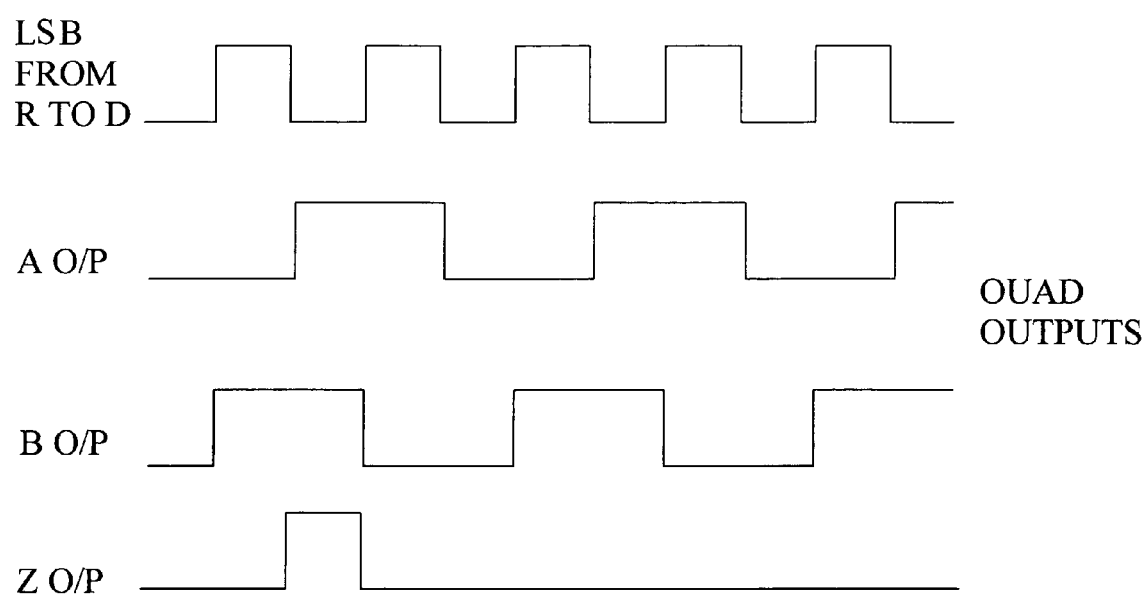
FIG. 4 is a diagram showing incremental output signals of an embodiment of the present invention.
Figure 5:
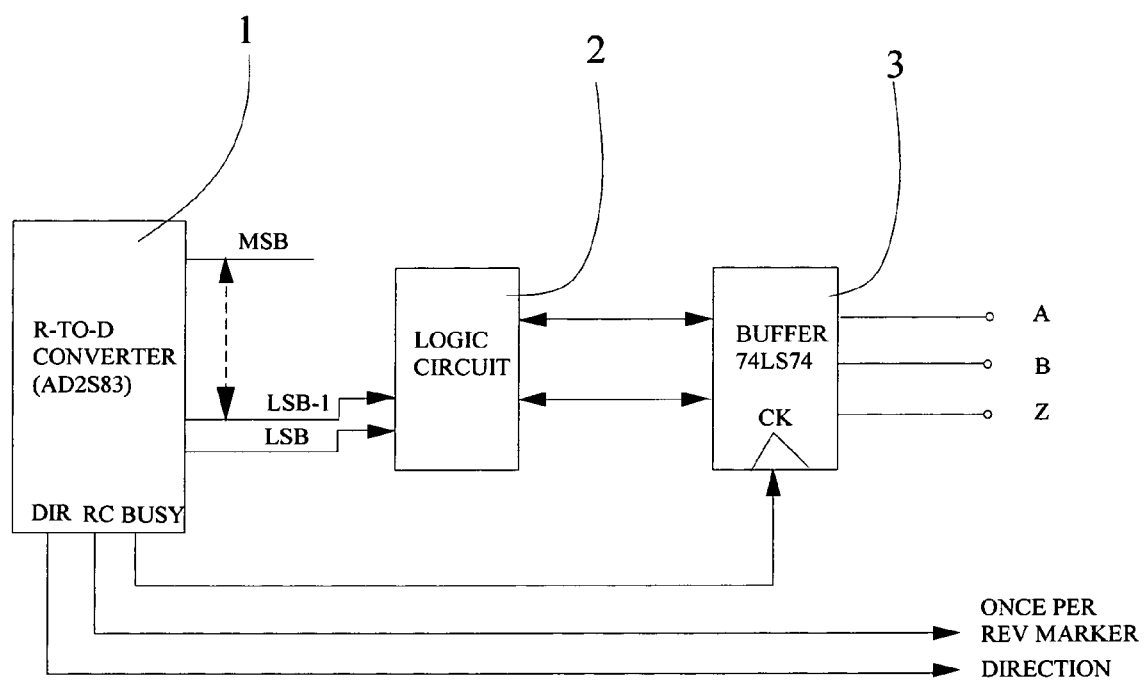
FIG. 5 is a block diagram showing a circuit of an embodiment according to the present invention.
Figure 6:
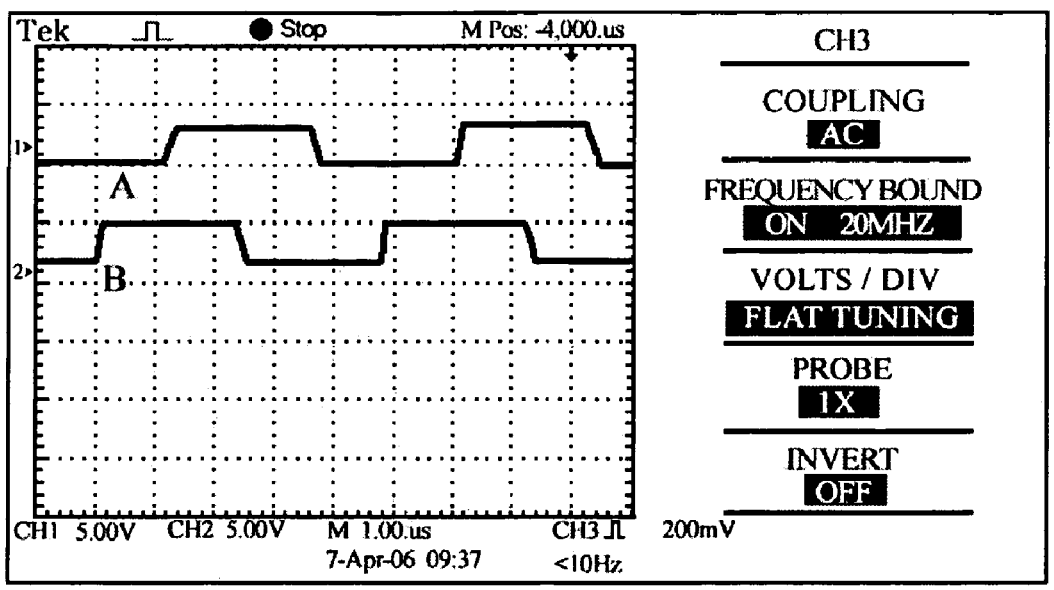
FIG. 6 is set of diagrams showing incremental output signals of an embodiment of the present invention.
Figure 6:
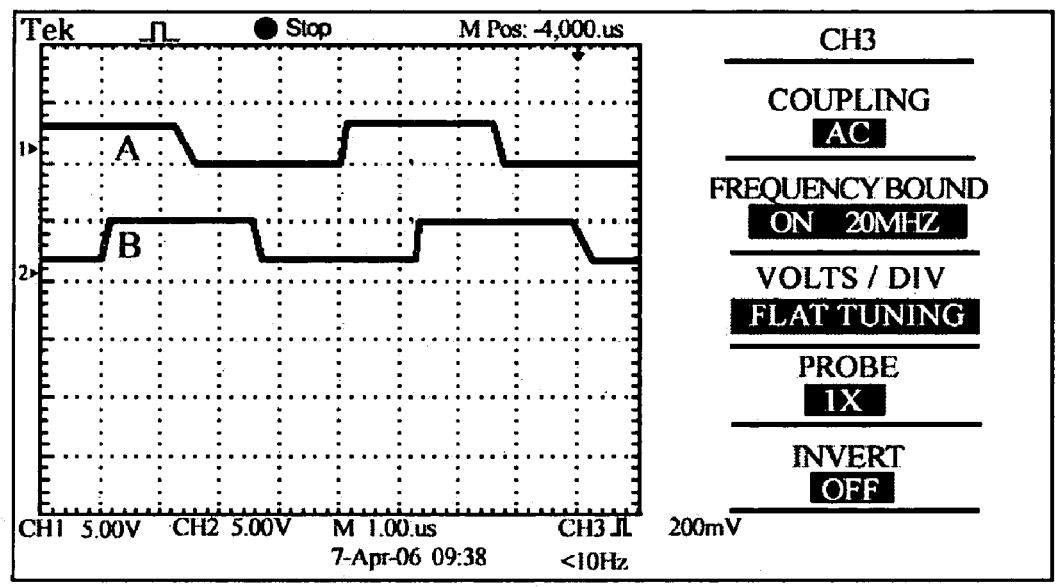

Please refer to FIGS. 4-6, an embodiment is used to illustrate the present invention and shall not be construed as a limit to disclosed subject matter.

FIG. 4 is a diagram showing incremental output signals of an embodiment of the present invention. In one embodiment, the RDC (Resolver-to-Digital Converter) is a monolithic integrated circuit and when be used in feedback control of a motor, it receives a feedback signal from a Resolver and converts it to a digital parallel output. Commercial RDC clips can be divided to two types—incremental A-B phase output and digital parallel output. The difference between the two types is substantially about the resolutions. Generally, an RDC with digital parallel output performs relatively higher resolution.

For instance, in one embodiment, the RDC of the present invention is an AD2S83 monolithic integrated circuit. AD2S83 is a monolithic integrated circuit performs high resolution and functions as supplying position and velocity data of the rotor during server control to accomplish a close-loop control of motor. The maximal resolution of AD2S83 is 16-bit and the 16 bits are indicated as DB0~DB15. Each special move to an adjacent pitch causes accumulation or regression. In addition, AD2S83 provides control pins including twisting direction (DIR), recount (RC), signal-processing indicating (BUSY) and ENABLE\DISABLE.

When a demodulated signal of Resolver is introduced to AD2S83, DB0~DB15 are accumulated or regressed subject to the rotating direction of the rotor which is indicated by DIR. Two minimal bits (LSB-LSB-1) thereof are taken for simulating as the clock source of A-B pulses. A signal-processing pin (BUSY) is used to output a TTL pulse wave as a control signal resource while LSB shifts from a low level to a high level and contrariwise. The circuit is depicted in FIG. 5 and the A-B phase waves are referred to FIG. 6.

Field Programmable Gate Array∘Further, as shown in FIG. 5, the digital processing where the binary signal move form RDC 1 to Buffer 3 through logic circuit 2 may be achieved by a traditional IC. However, in a case of all-digital-control-circuit of a motor, an additional logic processing may further be required. Thus, in a circuit with FPGA (field effect and field programmer-able gate array), the above-mentioned effect can be described by VHDL (Verilog Hardware Description Language) and burned into FPGA through an emulater.

Figure 7:
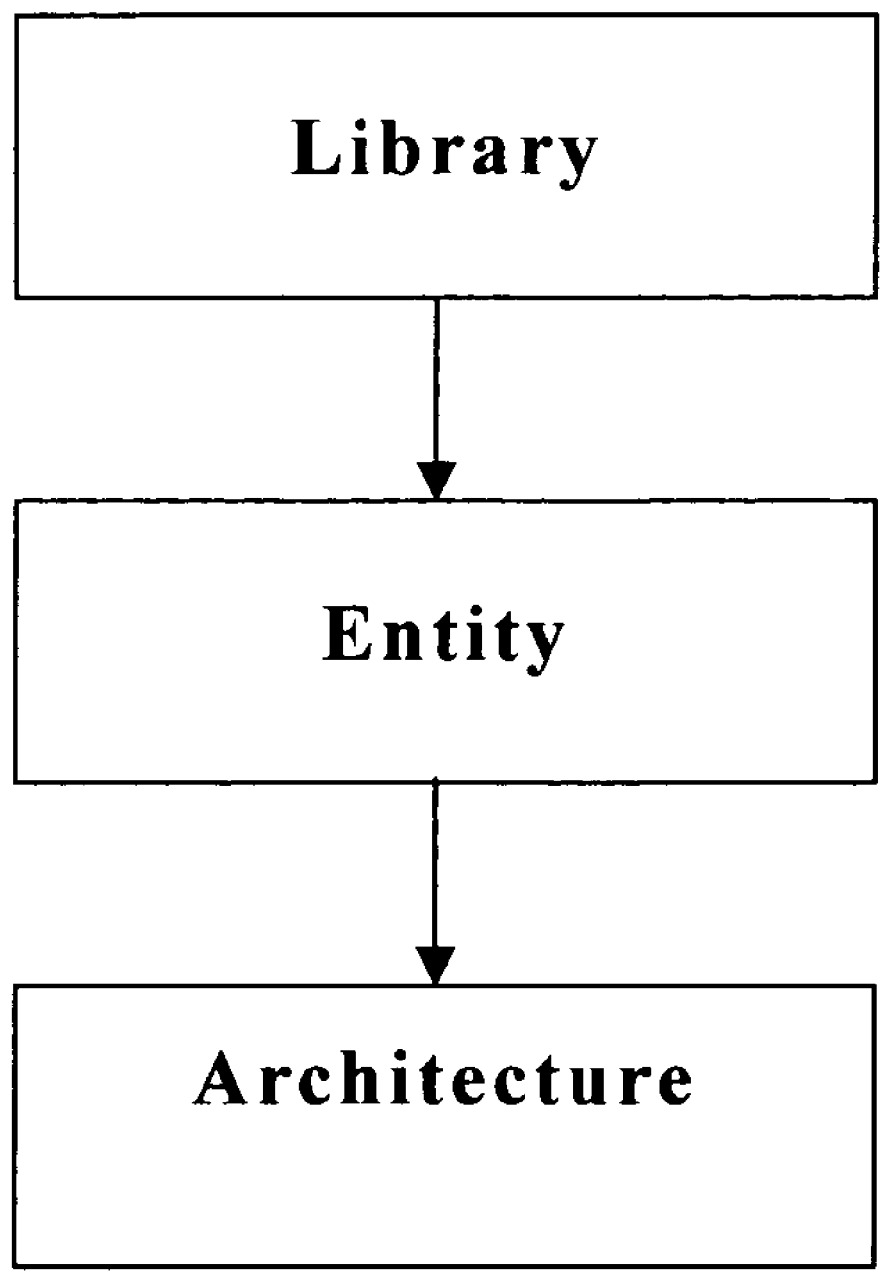
FIG. 7 is a block diagram showing VHDL structure of an embodiment of the present invention.

Please see FIG. 7 for the block diagram illustrating VHDL structure. Currently, VHDL has been a common standard language of the art. Instead of serial instructions used in normal programming language, VHDL is described by parallel instructions. Thus, the principal structure of VHDL contains Library, Entity and Architecture, wherein, Library is for interpreting definition group declared in the program, Entity is an interface (interface for describing I/O of the circuit) for describing Hierarchical Blocks and Architecture is for specifying inner structures or actions of the Entity (characteristics and operations of the circuit). After all the functions are programmed, the resultant VHDL can be burned into a FPGA clip.

As indicated above, the logic device for the transformation of the output of the RDC into series A-B pulses of the present invention achieves the following advantages:

1. By using with the disclosed subject matter of the invention, a high-resolution RDC can convert a 16-bit digital signal into an emulated A-B-Z phase output by means of an external circuit. Thus, a driver can read these feedback signals directly without needing a microprocessor and thereby the complexity and cost of the system can be significantly reduced.

2. The advantages of a FPGA (Field Effect and Field Programmer-Able Gate Array) clip are high processing speed, high density, elastic designability and lower cost. The chip configuration can be repeatedly and promptly planned for simulation verification. In the invention, a FPGA clip is taken as a foundation, through describing the function of circuit by VHDL to supersede a traditional circuit of digital logic IC. Thereupon, the occupation of the circuit board can be significantly reduced and more expandability as well as adaptability can be available.

Although a particular embodiment of the invention has been described in detail for purposes of illustration, it will be understood by one of ordinary skill in the art that numerous variations will be possible to the disclosed embodiments without going outside the scope of the invention as disclosed in the claims.

The invention claimed is:

1. A logic device for the transformation of the output of the Resolver-to-Digital Converter into series A-B pulses according to the present invention comprises:
    a chip with its two minimal bits (LSB-LSB-1) simulating as the clock source of A-B pulses,
    a signal-processing pin (BUSY) which output a Transistor-Transistor-Logic pulse wave as a control signal resource while LSB shifts from a low level to a high level and contrariwise, and
    a logic processing circuit as well as a buffer to output the displacement and velocity of a rotor in the form of A-B serial pulses.

2. The logic device for the transformation of the output of the RDC into series A-B pulses as claimed in claim 1, wherein a FPGA (Field Programmer-able Gate Array) clip which carries VHDL (Verilog Hardware Description Language) is used to accomplish the function of converting RDC output signals.

* * * * *